(12) United States Patent
Fastow

(10) Patent No.: US 8,754,463 B2
(45) Date of Patent: Jun. 17, 2014

(54) HIGH DENSITY NOR FLASH ARRAY ARCHITECTURE

(75) Inventor: Richard Fastow, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 315 days.

(21) Appl. No.: 13/043,677

(22) Filed: Mar. 9, 2011

(65) Prior Publication Data

US 2011/0156122 A1 Jun. 30, 2011

Related U.S. Application Data

(63) Continuation of application No. 11/823,518, filed on Jun. 28, 2007, now Pat. No. 7,910,976.

(51) Int. Cl.
*H01L 29/76* (2006.01)
*H01L 21/82* (2006.01)

(52) U.S. Cl.
USPC .................. 257/314; 257/E27.103; 438/128

(58) Field of Classification Search
USPC .......................... 257/314, E27.103; 438/128
See application file for complete search history.

(56) References Cited

U.S. PATENT DOCUMENTS

| | | | | |
|---|---|---|---|---|
| 4,737,829 A | * | 4/1988 | Morimoto et al. | 257/302 |
| 5,742,787 A | | 4/1998 | Talreja | 711/103 |
| 6,067,250 A | * | 5/2000 | Ravazzi et al. | 365/185.09 |
| 6,080,624 A | | 6/2000 | Kamiya et al. | 438/257 |
| 6,133,103 A | * | 10/2000 | Lee et al. | 438/276 |
| 6,291,846 B1 | * | 9/2001 | Ema et al. | 257/296 |
| 6,396,096 B1 | | 5/2002 | Park et al. | 257/296 |
| 6,495,470 B2 | | 12/2002 | Sadjadi et al. | 438/738 |
| 6,528,843 B1 | | 3/2003 | Wu | 257/315 |
| 7,820,516 B2 | | 10/2010 | Yang et al. | 438/294 |
| 2002/0064898 A1 | | 5/2002 | Adachi et al. | 438/41 |
| 2002/0167043 A1 | * | 11/2002 | Hashimoto | 257/316 |
| 2003/0122181 A1 | | 7/2003 | Wu | 257/315 |
| 2003/0156460 A1 | | 8/2003 | Wu | 365/185.33 |
| 2004/0130947 A1 | | 7/2004 | Fan et al. | 365/185.05 |
| 2005/0037572 A1 | * | 2/2005 | Lee | 438/257 |
| 2005/0139935 A1 | | 6/2005 | Lee | 257/390 |
| 2005/0141276 A1 | * | 6/2005 | Takeuchi et al. | 365/185.18 |
| 2005/0230714 A1 | * | 10/2005 | Komori et al. | 257/262 |
| 2006/0018181 A1 | | 1/2006 | Matsunaga et al. | 365/230.05 |
| 2006/0197136 A1 | | 9/2006 | Futatsuyama et al. | 257/314 |
| 2006/0209585 A1 | * | 9/2006 | Tanizaki et al. | 365/148 |
| 2006/0231822 A1 | | 10/2006 | Kim | 257/1 |
| 2006/0276032 A1 | | 12/2006 | Arakawa et al. | 438/637 |
| 2006/0286750 A1 | * | 12/2006 | Fang et al. | 438/262 |
| 2007/0036016 A1 | | 2/2007 | Takeuchi et al. | 365/212 |
| 2007/0045705 A1 | * | 3/2007 | Ikeda | 257/314 |
| 2007/0176214 A1 | * | 8/2007 | Kwon et al. | 257/250 |
| 2007/0257299 A1 | * | 11/2007 | Chen et al. | 257/315 |
| 2007/0268746 A1 | | 11/2007 | Choi et al. | 365/185.05 |

OTHER PUBLICATIONS

M. Wei, et al., "A Scalable Self-Aligned Contact NOR Flash Technology," Jun. 12, 2007, pp. 1-2.

* cited by examiner

*Primary Examiner* — Matthew Landau
*Assistant Examiner* — Igwe U Anya
(74) *Attorney, Agent, or Firm* — Dorsey & Whitney LLP

(57) ABSTRACT

In one embodiment of the invention, a memory includes wordline jogs and adjacent spacers. Spacers from different wordlines may contact one another on either side of a drain contact and consequently isolate and self-align the contact in the horizontal and vertical directions.

25 Claims, 2 Drawing Sheets

HIGH DENSITY NOR FLASH ARRAY ARCHITECTURE

CROSS-REFERENCE TO RELATED APPLICATIONS

This application is a continuation of U.S. patent application Ser. No. 11/823,518, filed on Jun. 28, 2007, and issued as U.S. Pat. No. 7,910,976 on Mar. 22, 2011. This application and patent are each incorporated herein by reference, in their entirety, for any purpose.

BACKGROUND

NOR flash memory architecture typically includes an array of wordlines, bitlines, and source rails. When self-aligned contact (SAC) techniques are utilized, spacers may be formed adjacent to the wordlines to provide guides for drain contacts. However, the spacers only provide isolation or self-alignment in the vertical direction. In other words, the contacts are only self-aligned perpendicular to the wordlines by the wordline spacer. In the direction parallel to the wordlines the contacts are not self-aligned and require a masking step for isolation.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

Figure 1:
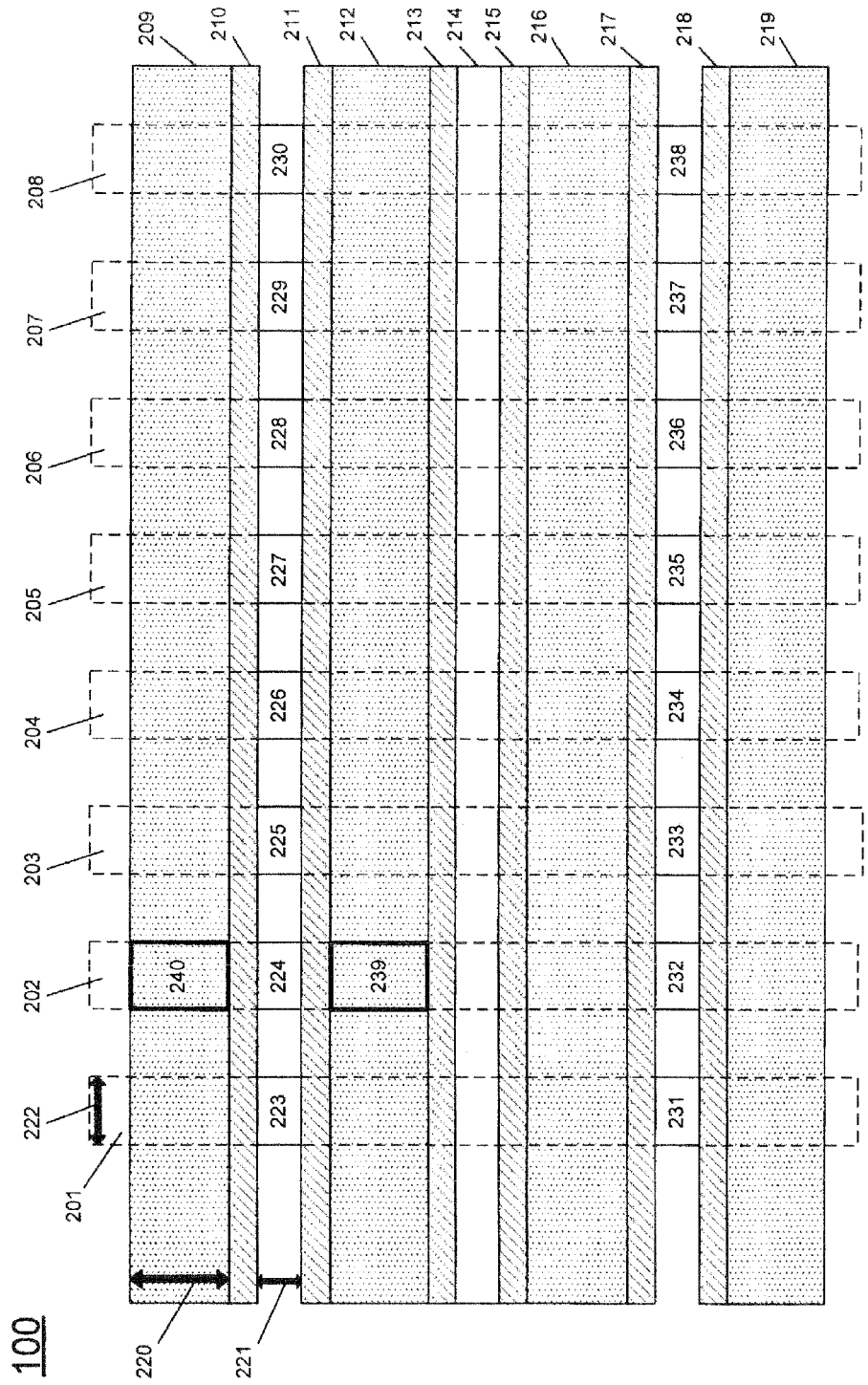
FIG. 1 is top view of a traditional memory device.

FIG. 1 is top view of a traditional SAC NOR flash memory array 100. The array 100 includes bitlines 201, 202, 203, 204, 205, 206, 207, 208, wordlines 209, 212, 216, 219 adjacent to spacers 210, 211, 213, 215, 217, 218, common source rail 214, and drain contacts 223, 224, 225, 226, 227, 228, 229, 230, 231, 232, 233, 234, 235, 236, 237, 238. The wordlines may be 110 nm+/−15 nm in the vertical direction (parallel to bitlines). Bitlines may be formed ½ pitch wide (e.g., 58 nm) in the horizontal direction parallel to wordlines. Oxide spacers may be 30 nm wide in the vertical direction. Drain contact 223, for example, may be 58 nm (horizontal)×40 nm (vertical). Each drain contact (e.g., 224) is shared by two flash memory cells (e.g., 239, 240). To access memory cell 239, bitline 202 and wordline 212 are selected.

The drain contacts (e.g., 223) may be self-aligned perpendicular to the wordlines 209, 212, 216, 219 by the wordline spacers 210, 211, 213, 215, 217, 218. In the direction parallel to the wordlines, however, the contacts are not self-aligned and require a masking step to prevent them from, for example, shorting with one another.

Figure 2:
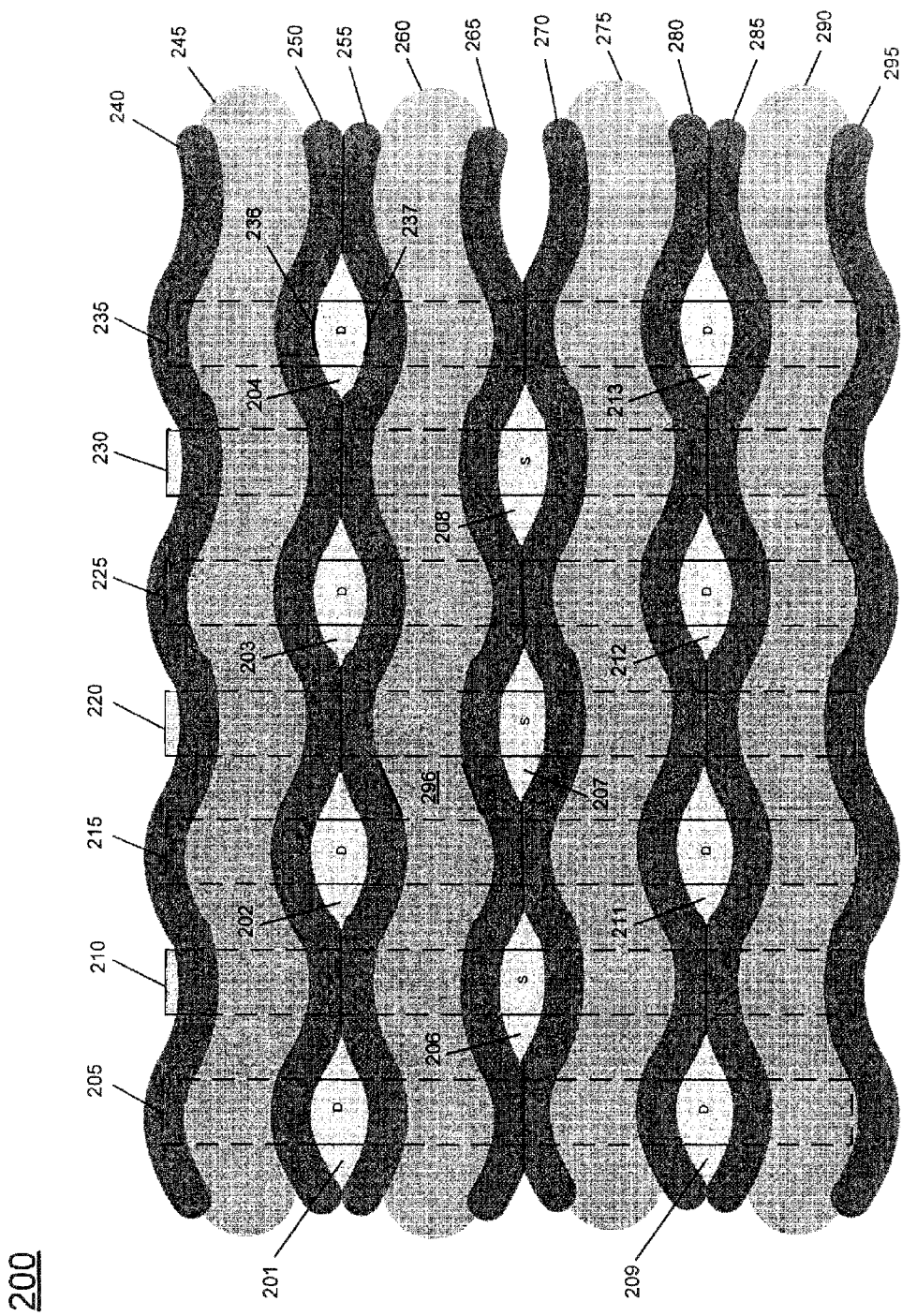
FIG. 2 is a top view of a memory device in one embodiment of the invention.

FIG. 2 is a top view of a memory device in one embodiment of the invention. NOR flash array 200 includes spacers (e.g., oxide) 240, 250, 255, 265, 270, 280, 285, 295 formed adjacent to wordlines 245, 260, 275, 290. The memory also includes bitlines 205, 215, 225, 235, source lines 210, 220, 230, drain contacts 201, 202, 203, 204, 209, 211, 212, 213, and source contacts 206, 207, 208.

In the absence of a common source rail, individual source contacts 206, 207, 208 may be utilized to implement a virtual ground architecture in one embodiment of the invention. In other words, without a dedicated source rail (e.g., 214 of FIG. 1) the source contacts may operate as virtual grounds. The common source rail is replaced by source contacts having the same dimension as the drain contacts. The source contacts 206, 207, 208 are staggered with respect to the drain contacts 201, 202, 203, 204, 209, 211, 212, 213, thereby allowing a given cell (e.g., 296) to be accessed by selecting a drain contact (bitline), a source contact (sourceline), and a wordline. To select a memory cell (e.g., 296), bitline 215, source line 220, and wordline 260 are selected.

In one embodiment of the invention, memory 200 is created using SAC techniques to form the spacers 240, 250, 255, 265, 270, 280, 285, 295. Periodic wordline jogs, bends, or kinks are utilized to form wordlines and spacers around the source and drain contacts. For example, spacers 250, 255 directly contact one another on either side of drain contact 202. In doing so, contact 202 is isolated and self-aligned in two directions. In other words, the source and drain contact openings may be self-aligned in two directions, both parallel (i.e., horizontal) and perpendicular (i.e., vertical) to the wordlines. Thus, unlike traditional NOR flash memories utilizing SAC techniques, the contacts may not require a masking step to define them in the vertical direction (direction parallel to the wordlines). This facilitates contact definition and filling.

In one embodiment of the invention, the source (e.g., 206) and/or drain contact (e.g., 202) dimensions may be larger than, for example, traditional drain contacts (e.g., 223 of FIG. 1). More specifically, use of a virtual ground architecture allows drain contacts to be expanded in the horizontal direction. In one embodiment of the invention, the drain contacts 201, 202, 203, 204, 209, 211, 212, 213 may be formed at 2×½ pitch wide (e.g., 2×58 nm 116 nm) and may be shared by four flash cells. Furthermore, the rounded portions 236, 237 of spacers 250, 255 increase the contact dimension in the vertical direction. In one embodiment of the invention, the wordline jogs include a 10 nm curvature 236, 237. Thus, a typical 40 nm high (vertical) contact may increase 10 nm in the vertical direction for each 10 nm curvature. For example, with two spacers each including a 10 nm curve away from a straight wordline embodiment, an extra 20 nm may be gained. In other words, the contact may be 60 nm (40+10+10=60 nm) in the vertical direction. The source contacts may have the same dimensions as the drain contacts.

Thus, in light of the foregoing, the SAC process may be implemented at smaller dimensions. For example, NOR flash architecture may be scaled to the 32 nm node.

In one embodiment of the invention a NOR flash memory array may include bitlines (e.g., 215), source lines (e.g., 220), wordlines (e.g., 245, 260, 275) coupled to spacers (e.g., 250, 255, 265, 270), drain contacts (e.g., 202) coupled to bitlines, and source contacts (e.g., 207) coupled to source lines. The spacers may connect to one another to consequently surround and isolate drain contacts (e.g., 202) and source contacts (e.g., 207) in a plane that is perpendicular (i.e., vertical) and parallel (i.e., horizontal) to wordlines. The contacts may directly connect to rounded portions 236, 237 of the spacers 250, 255.

Regarding methods for manufacturing the above embodiments of the invention, traditional techniques known to those of ordinary skill in the art may be employed.

Regarding wordline jog formation, a traditional wiggled or jogged wordline offset may be employed to achieve maximized contact areas for the drain and source contacts. Specifically, during the course of fabricating the contacts, a lithographic pattern that is capable of forming undulating wordlines that jog around contact openings may be employed.

Regarding SAC techniques, the SAC architecture may be implemented in one embodiment of the invention as follows. An oxide film may be formed over the wordlines. The thickness of the oxide film may determine the approximate width of spacers to be formed from the oxide layer. An anisotropic etch may be performed to etch back the oxide layer and form spacers. In another embodiment of the invention, an oxide-nitride-oxide (ONO) ($SiO_2$—$Si_3N_4$—$SiO_2$) tri-layer spacer may be used implementing traditional techniques.

The spacers must be wide enough (e.g., 30 nm) to protect the sides of wordlines (e.g., 245, 260) from both contamination and any possible contact with a conductive material subsequently deposited within a contact opening formed between the spacers. In one embodiment of the invention, the spacers may be jogged (i.e., bent, kinked, wiggled) and include curvature or rounding to the extent that the spacers contact one another in multiple locations to subsequently isolate the future contacts in the vertical and horizontal directions. However, the spacers must be narrow enough to allow sufficient electrical contact between the conductive material used to fill the contact opening (e.g., 202) formed between the spacers and the underlying semiconductor substrate.

With a dielectric material (e.g., oxide) deposited over the wordlines, and with guidance from the spacers, a contact material such as, but not limited to, tungsten may be deposited in the contact openings by depositing a tungsten layer. The tungsten layer may then be polished back leaving tungsten only in the contact openings. Thus, the contact holes function as a form of mask for depositing tungsten in the contact openings. In one embodiment of the invention, silicon may be epitaxially grown in the contact holes to partially fill the holes. A tungsten layer may then be deposited and polished back leaving tungsten only in the contact holes.

Therefore, spacers (e.g., 250, 255) will prevent contacts (e.g., 202, 203, 205, 207) and/or wordlines (245, 260, 275) from shorting. In addition, since dimensions (i.e., horizontal and vertical distances) of the contact opening are defined by the distance between spacers, the contact dimensions are defined by the spacer width rather than the photolithographic technology employed.

Regarding usage of the various embodiments of the invention, the usage is similar to that of traditional flash memories. In other words, erasure of a block of the flash memory array requires that high voltage be supplied to the memory transistors. Voltage control circuitry may contain switches to supply the required voltage levels to the flash memory array during read, program, and erase operations. The programming of the flash memory transistor may be accomplished by applying VPP (12 volts) to a gate, VPP/2 (6 volts) to a drain, and grounding the source of the memory transistor. This process attracts electrons to the floating gate of the memory transistor by hot electron injection. The flash memory transistors may be erased by applying VPP (12 volts) to the source, grounding the gate, and allowing the drain of the transistor to float. The electrons are thus tunneled away from the floating gate. Reading of flash memory transistors may be performed by applying VCC (5 volts or 3 volts) to the gate, grounding the source, and applying 1 volt to the drain. The amount of drain-source current $I_{DS}$ is then sensed to determine whether the transistor is in the programmed or erased state. For one embodiment of the invention, voltage control circuitry may also contain internal power circuits that supply the necessary voltages for operating the flash memory device if the external supply levels are less than the required values.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor memory comprising:
   parallel alternating drain bitlines and source lines;
   first and second parallel word lines perpendicular to said bitline; and
   a pair of spacers along said first and second parallel word lines;
   wherein said first and second parallel word lines form isolated contact openings for staggered bitline and source line contacts and wherein the pair of spacers abut outside of the staggered bitline and source line contacts.

2. The memory of claim 1 wherein said memory is a virtual ground memory.

3. The memory of claim 1 wherein the pair of spacers are on either side of the first and second parallel word lines.

4. The memory of claim 3 wherein said pair of spacers are sinusoidal.

5. The memory of claim 4 including a plurality of parallel bitlines and a plurality of pairs of first and second parallel word lines, wherein said pair of spacers of said first and second word lines contact at every of said source lines.

6. The memory of claim 5 wherein said spacers are spaced apart on every bitline to enable bitline contacts.

7. The memory of claim 1 wherein said memory is a NOR flash memory.

8. The memory of claim 1 including source and drain contacts staggered in the bitline and word line directions.

9. The memory of claim 1 including sources and drains and first contacts to sources and second contacts to drains, said source and drain contacts being isolated by adjacent pairs of spacers.

10. The memory of claim 1 including a plurality of parallel drain bitlines and a plurality of source lines, and said memory including a plurality of parallel word lines, each word line including an adjacent first word line and second word line.

11. The semiconductor memory of claim 1, wherein said first and second parallel word lines are sinusoidal.

12. A method comprising:
    forming a plurality of bitlines, each of said bitlines including parallel drain and source lines and staggered drain and source contacts, wherein the drain and source lines alternate across the plurality of bitlines;
    forming a plurality of sinusoidal word line pairs perpendicular to said bitlines, each word line pair including a first word line coupled to said drain line and the second word line coupled to said source line;

forming spacers on either side of each of said sinusoidal word line pairs; and abutting said spacers outside of said staggered drain and source contacts to isolate said staggered drain and source contacts.

13. The method of claim 12 including forming sinusoidal spacers.

14. The method of claim 12 including forming the spacers of the first and second word line pairs to contact at every one of said source lines.

15. The method of claim 12 including spacing said spacers apart on every drain line to provide space for drain line contacts.

16. The method of claim 12 including forming source and drain contacts staggered in the bitline and word line directions.

17. The method of claim 12 including forming source and drain contacts isolated by adjacent spacers.

18. A memory comprising:
a plurality of parallel bitline pairs, each bitline pair including parallel drain and source lines, wherein the drain and source lines alternate across the plurality of bitline pairs;
a plurality of parallel word line pairs perpendicular to said bitline pairs, each word line pair including a first word line coupled to said drain line and the second word line coupled to said source line;
a plurality of spacers that run alongside said word line pairs; and
a plurality of staggered contacts, wherein each of the plurality of staggered contacts are isolated between sinusoidal word lines by the plurality of spacers abutting outside of said plurality of staggered contacts.

19. The memory of claim 18 wherein said memory is a virtual ground memory.

20. The memory of claim 18 wherein said spacers are sinusoidal.

21. The memory of claim 20, wherein spacers of said first and second word lines contact at every of said source lines.

22. The memory of claim 21 wherein said spacers are spaced apart on every drain line to enable drain line contacts.

23. The memory of claim 22 including sources and drains and first contacts to sources and second contacts to drains, said source and drain contacts being isolated by adjacent spacers.

24. The memory of claim 18 wherein said memory is a NOR flash memory.

25. The memory of claim 18 wherein the plurality of contacts are staggered in the bitline and word line directions.

* * * * *